United States Patent
Lee

(10) Patent No.: US 11,763,912 B2
(45) Date of Patent: Sep. 19, 2023

(54) INTEGRATED CIRCUIT, POWER VERIFICATION CIRCUIT AND POWER VERIFICATION METHOD

(71) Applicant: Nuvoton Technology Corporation, Hsinchu (TW)

(72) Inventor: Liang-Chuan Lee, Hukou Township, Hsinchu County (TW)

(73) Assignee: NUVOTON TECHNOLOGY CORPORATION, Hsinchu Science Park (TW)

(*) Notice: Subject to any disclaimer, the term of this patent is extended or adjusted under 35 U.S.C. 154(b) by 166 days.

(21) Appl. No.: 17/225,792

(22) Filed: Apr. 8, 2021

(65) Prior Publication Data

US 2021/0319842 A1    Oct. 14, 2021

(30) Foreign Application Priority Data

Apr. 9, 2020    (TW) .................................. 109111900

(51) Int. Cl.
*G11C 29/50*    (2006.01)
*G01R 31/317*    (2006.01)
*G11C 13/00*    (2006.01)

(52) U.S. Cl.
CPC .. *G11C 29/50004* (2013.01); *G01R 31/31721* (2013.01); *G11C 13/0038* (2013.01); *G11C 2029/5004* (2013.01)

(58) Field of Classification Search
CPC .......... G11C 29/50004; G11C 13/0038; G11C 2029/5004; G11C 13/0002; G01R 31/31721; G06F 30/33; G06F 30/337
See application file for complete search history.

(56) References Cited

U.S. PATENT DOCUMENTS

| | | | | |
|---|---|---|---|---|
| 9,601,195 | B2* | 3/2017 | Buchanan | H01L 27/2463 |
| 9,818,481 | B2* | 11/2017 | Park | G11C 13/0033 |
| 9,912,334 | B2* | 3/2018 | Das | H03K 19/017581 |
| 11,264,093 | B1* | 3/2022 | Lee | G11C 13/0028 |
| 2008/0031032 | A1* | 2/2008 | Farnworth | G11C 13/0069 |
| | | | | 365/148 |
| 2015/0287439 | A1* | 10/2015 | Nishikawa | G11C 7/24 |
| | | | | 365/72 |
| 2017/0099049 | A1* | 4/2017 | Sandhu | G11C 29/026 |

FOREIGN PATENT DOCUMENTS

TW    201508747 A    3/2015

* cited by examiner

*Primary Examiner* — Raul J Rios Russo
*Assistant Examiner* — Dilara Sultana
(74) *Attorney, Agent, or Firm* — Muncy, Geissler, Olds & Lowe, P.C.

(57) ABSTRACT

A power verification circuit is provided. The power verification circuit includes a current source, a resistive random access memory (RRAM) cell and a Zener diode. The current source is coupled to a power terminal. The RRAM cell is coupled between the current source and a ground terminal. The Zener diode has an anode coupled to the RRAM cell and a cathode coupled to the power terminal. The impedance of the RRAM cell is determined by the power voltage applied to the power terminal.

15 Claims, 6 Drawing Sheets

INTEGRATED CIRCUIT, POWER VERIFICATION CIRCUIT AND POWER VERIFICATION METHOD

CROSS REFERENCE TO RELATED APPLICATIONS

This application claims priority of Taiwan Patent Application No. 109111900, filed on Apr. 9, 2020, the entirety of which is incorporated by reference herein.

BACKGROUND OF THE INVENTION

Field of the Invention

The invention relates to a power verification circuit, and more particularly to an integrated circuit with a power verification circuit.

Description of the Related Art

Nowadays, integrated circuits (ICs) are widely used in various electronic products. When the operation of the IC is abnormal, the electronic product will not power on or operate normally. Therefore, when the operation of the IC is abnormal or damaged, the IC needs to be analyzed to determine the type of abnormality. For example, the abnormal condition is caused by the internal circuit of the IC or an external application circuit (such as circuits or devices on a printed circuit board).

FIG. 1 shows a general verification flow of abnormal response of an IC. In stage 110, the client (i.e., the company that manufactures the electronic product) finds that the IC is abnormal and the electronic product cannot be used normally. Next, in stage 120, the field application engineer (FAE) of the IC design (or production or manufacturing) company (or house) will obtain an abnormal IC from the client. Next, in stage 120, the field application engineer will perform preliminary troubleshooting on the abnormal IC, for example, to confirm whether the version of the IC and the corresponding application program are correct. Next, in stage 130, the research and design (R&D) engineer, the application engineer (AE), and/or the test engineer within the IC design company will further analyze the abnormal IC provided by the FAE. Next, in stage 140, after obtaining the analysis result, the IC design company will provide the analysis result to the customer through the FAE.

It can be seen from the conventional verification flow in FIG. 1 that when a customer reacts to an abnormality of an IC, it is not easy to quickly determine whether the failure of the IC is caused by an abnormality within the IC or an abnormality of the customer application environment. As a result, the abnormal IC will go back and forth between various relevant engineering personnel for cross-departmental cooperation verification, thus consuming a lot of labor costs and verification time.

Therefore, it is desired that a mechanism that can quickly determine the failure mode of an IC.

BRIEF SUMMARY OF THE INVENTION

Integrated circuit, power verification circuit and power verification method are provided. An embodiment of a power verification circuit is provided. The power verification circuit includes a current source, a resistive random access memory (RRAM) cell and a Zener diode. The current source is coupled to a power terminal. The resistive random access memory cell is coupled between the current source and a ground. The Zener diode has an anode coupled to the resistive random access memory cell and a cathode coupled to the power terminal. The impedance of the resistive random access memory cell is determined by the power voltage applied to the power terminal.

Furthermore, an embodiment of an integrated circuit (IC) is provided. The IC includes a power pin, a test pin and a power verification circuit. The power pin is configured to receive the power voltage. The power verification circuit includes a current source, a Zener diode, and a resistive random access memory (RRAM) cell. The current source is coupled between the power pin and the test pin. The Zener diode has an anode coupled to the test pin and a cathode coupled to the power pin. The resistive random access memory cell is coupled between the test pin and a ground. A voltage of the test pin is configured to indicate whether the power voltage exceeds a maximum operating voltage of the IC, and the maximum operating voltage is the breakdown voltage of the Zener diode. When the power voltage exceeds or equals the maximum operating voltage of the IC, the test pin has a high voltage level, and when the power voltage does not exceed the maximum operating voltage of the IC, the test pin has a low voltage level.

Moreover, an embodiment of a power verification method is provided. An integrated circuit (IC) is obtained. The integrated circuit includes a test pin, a current source coupled between a power terminal and the test pin, a resistive random access memory (RRAM) cell coupled between the test pin and a ground, and a Zener diode. The Zener diode has an anode coupled to the test pin and a cathode coupled to the power terminal. The impedance of the resistive random access memory cell is obtained according to a voltage of the test pin. It is determined whether the power voltage applied to the power terminal exceeds the maximum operating voltage of the integrated circuit according to the impedance of the resistive random access memory cell. The maximum operating voltage is the breakdown voltage of the Zener diode.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
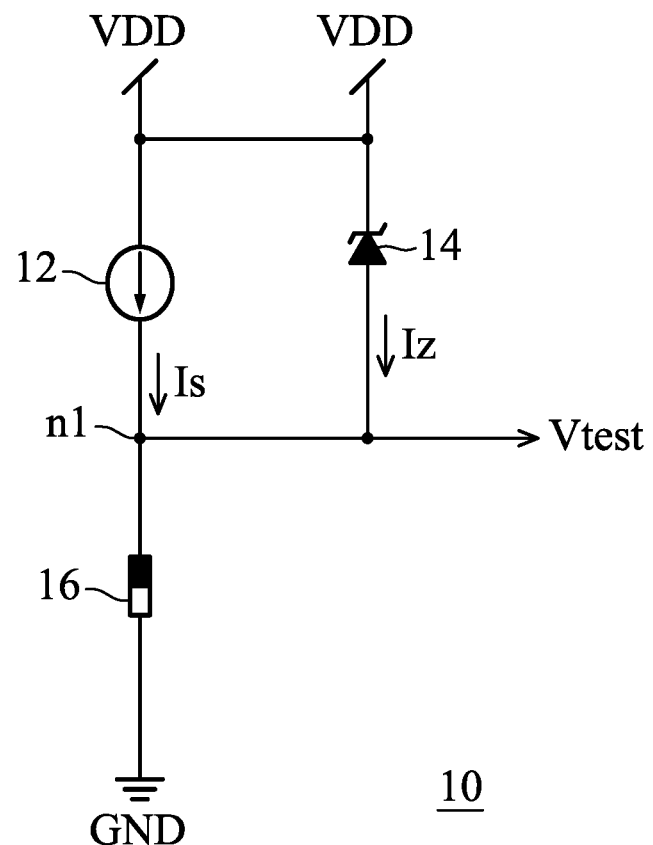
FIG. 2 shows a power verification circuit according to some embodiment of the invention.

FIG. 2 shows a power verification circuit 10 according to some embodiment of the invention. The power verification circuit 10 includes a current source 12, a Zener diode 14, and a resistive random access memory (RRAM) unit 16. The current source 12 is coupled between a power terminal VDD and a node n1 for providing a current $I_S$ to the RRAM unit 16. The Zener diode 14 is coupled between the power terminal VDD and the node n1, i.e., the Zener diode 14 is connected in parallel to the current source 12. Furthermore, the anode of the Zener diode 14 is coupled to the node n1, and the cathode of the Zener diode 14 is coupled to the power terminal VDD. The RRAM unit 16 is coupled between the node n1 and a ground GND.

In general, the RRAM achieves the memory effect by changing the impedance value, and uses its non-volatile characteristics as a memory element. The RRAM has the advantages of small operating voltage, long memory time, multi-state memory, simple structure and small area. By setting or resetting the resistive memory through the current, the impedance value of the resistive memory can be changed so as to store data in the resistive memory. It is to be noted that the current $I_S$ from the current source 12 cannot set and reset the RRAM 16.

Figure 3:
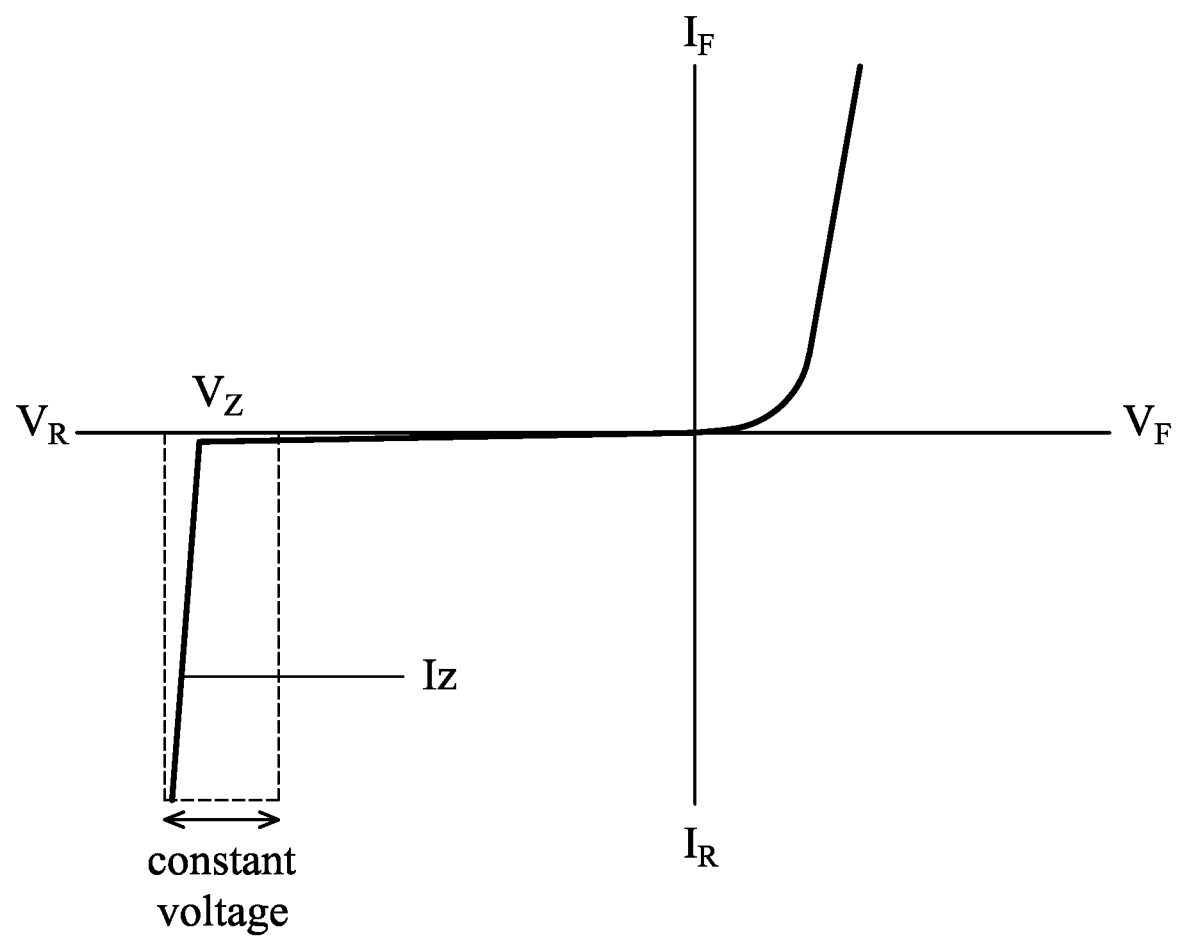
FIG. 3 shows the current and voltage curve of a general Zener diode.

When the Zener diode is forward-biased, i.e., conducted (or turned on) in one direction, the Zener diode can function as a general transistor. However, when the Zener diode is reverse-biased on a threshold voltage (i.e., a breakdown voltage), the Zener diode is conducted (or turned on) in the reverse direction. FIG. 3 shows the current and voltage curve of a general Zener diode. In FIG. 3, $V_F$ represents a forward bias voltage, $V_R$ represents a reverse bias voltage, $I_F$ represents a forward bias current, and $I_R$ represents a reverse bias current. In FIG. 3, when the reverse bias is over a certain voltage, namely the Zener threshold voltage or the breakdown voltage $V_Z$, for example, generally higher than about 5V, a sudden rise in the reverse current (i.e., $I_Z$) occurs. In other words, when the Zener diode is reverse biased, a knee or sharp turn will appear in the current-voltage curve of the Zener diode. In the case of reverse bias, when the reverse current is further increased, the voltage across the Zener diode is substantially a constant voltage.

Referring back to FIG. 2, when the power voltage PWR applied to the power terminal VDD does not exceed the breakdown voltage $V_Z$ of the Zener diode 14, the Zener diode 14 does not turn on. Therefore, only the current $I_S$ flows through the RRAM cell 16. As described above, the current $I_S$ from the current source 12 cannot set and reset the RRAM 16. In some embodiments, the current $I_S$ is less than the breakdown current when the Zener diode 14 is reverse conducted (or turned on). Therefore, the RRAM cell 16 has a low impedance, and the test voltage Vtest on the node n1 is a low voltage level. In some embodiments, the low impedance RRAM cell 16 indicates that the data stored in the RRAM cell 16 is a logic "0". Furthermore, in some embodiments, the initial state of the RRAM cell 16 is the low impedance. On the contrary, when the power voltage PWR applied to the power terminal VDD exceeds or equals the breakdown voltage $V_Z$ of the Zener diode 14, the Zener diode 14 is reversely conducted (or turned on) and a large current $I_Z$ is generated (or provided) to the RRAM cell 16. Thus, the current $I_S$ and the current $I_Z$ will flow through the RRAM cell 16 at the same time. In addition, the amount of current $I_Z$ is sufficient to change the impedance state of the RRAM cell 16 to a high impedance. Therefore, the test voltage Vtest on the node n1 is at a high voltage level. In some embodiments, the high-impedance RRAM cell 16 indicates that the data stored in the RRAM cell 16 is a logic "1".

In FIG. 2, the breakdown voltage $V_Z$ of the Zener diode 14 is substantially equal to the maximum operating value Vmax of the power voltage PWR applied to the power terminal VDD, i.e., $V_Z$=Vmax. In other words, when the power voltage PWR applied to the power terminal VDD exceeds the maximum operating value Vmax, the Zener diode 14 is reversely conducted (or turned on) to provide a large current to the RRAM cell 16, so as to change the impedance state of the RRAM cell 16 to the high impedance. Thus, the test voltage Vtest on the node n1 is the voltage level. Therefore, in the power verification circuit 10, it is determined whether the power voltage PWR applied to the power terminal VDD exceeds the maximum operation value Vmax according to the impedance state of the RRAM cell 16. Moreover, the power verification circuit 10 can be implemented in the ICs and other circuits.

Figure 4:
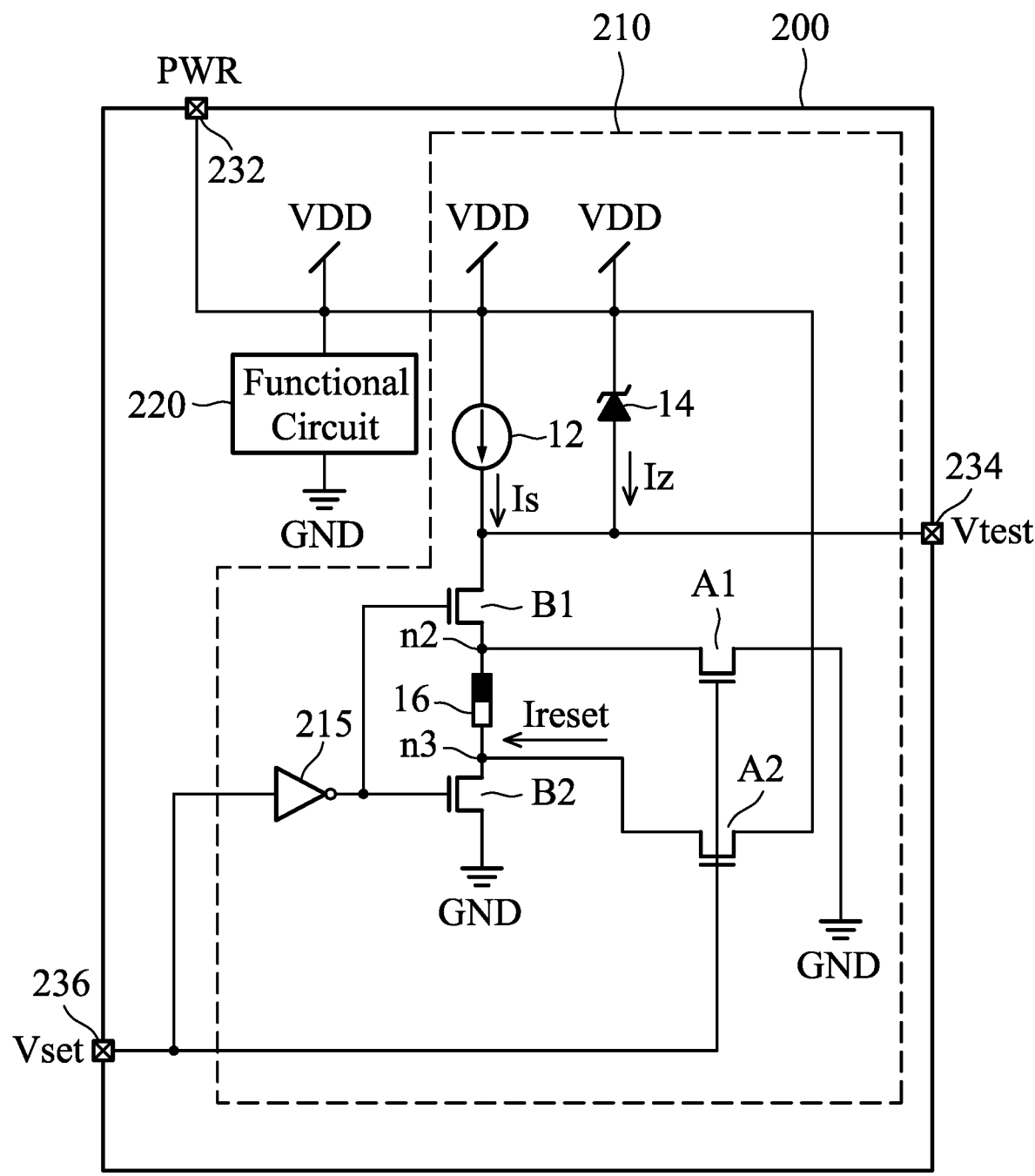
FIG. 4 shows an integrated circuit (IC) according to some embodiments of the invention.

FIG. 4 shows an integrated circuit (IC) 200 according to some embodiments of the invention. The IC 200 includes a power verification circuit 210 and one or more functional circuits (or core circuits) 220. In the IC 200, the power terminals VDD of the power verification circuit 210 and the functional circuits 220 are coupled to a power pin 232, and a ground GND of the power verification circuit 210 and the functional circuits 220 are coupled to a ground pin (not display). The power pin 232 and the ground pin (not shown) are respectively coupled to the power terminal and the ground of other circuits or devices (such as a printed circuit board). In addition, the power terminals VDD of the power verification circuit 210 and the functional circuits 220 are powered by the power voltage PWR applied to the power pin 232. When the power voltage PWR exceeds a maximum operating voltage of the IC 200, it may cause damage to the IC 200 or abnormal operation. The power verification circuit 210 is capable of verifying whether the power voltage PWR exceeds the maximum operating voltage of the IC 200.

The power verification circuit 210 includes a current source 12, a Zener diode 14, an RRAM cell 16, an inverter 215, and the transistors A1, A2, B1, and B2. The current source 12 is coupled between the power pin 232 (or the power terminal VDD) and the test pin 234 and is configured to provide a current $I_S$ to the RRAM cell 16. The Zener diode 14 is coupled between the power pin 232 (or the power terminal VDD) and the test pin 234, i.e., the Zener diode 14 is connected in parallel to the current source 12. Furthermore, the anode of the Zener diode 14 is coupled to the test pin 234, and the cathode of the Zener diode 14 is coupled to the power pin 232. In addition, the breakdown voltage $V_Z$ of the Zener diode 14 is substantially equal to the maximum operating voltage of the IC 200. The transistor B1 is coupled between the test pin 234 and a node n2. The RRAM cell 16 is coupled between the node n2 and a node n3. The transistor B2 is coupled between the node n2 and the ground GND. The transistor A1 is coupled between the node n2 and the ground GND, and the transistor A2 is coupled between the node n3 and the power pin 232 (or the power terminal VDD).

In such embodiment, the transistors A1, A2, B1, and B2 are N-type transistors. Moreover, the gates of the transistors A1 and A2 are coupled to a set pin 236 for receiving a setting signal Vset. An input terminal of the inverter 215 is coupled to the set pin 236 and is used to receive the setting signal Vset from the set pin 236. An output terminal of the inverter 215 is coupled to the gates of the transistors B1 and B2, and is configured to provide the reverse setting signal Vset to the transistors B1 and B2. In the power verification circuit 210, when the setting signal Vset controls the transistors A1 and A2 to be turned on, the transistors B1 and B2 are turned off. On the contrary, when the setting signal Vset controls the transistors B1 and B2 to be turned on, the transistors A1 and A2 are turned off.

When the setting signal Vset is at a low logic level, for example, a logic "0", the power verification circuit 210 is operated in a detection mode. In the detection mode, the setting signal Vset may control the transistors B1 and B2 to be turned on, and controls the transistors A1 and A2 to be turned off. Therefore, in the detection mode, the circuit of the power verification circuit 210 is substantially similar to the power verification circuit 10 of FIG. 2. As described above, when the power voltage PWR applied to the power contact 232 does not exceed the breakdown voltage $V_Z$ of the Zener diode 14, the Zener diode 14 will not turn on, and only the current $I_S$ flows through the RRAM cell 16. Therefore, the RRAM cell 16 has a low impedance, and the test voltage Vtest on the test pin 234 is a low voltage level or a low logic level, for example, a logic "0". On the contrary, when the power voltage PWR applied to the power contact 232 exceeds or equals the breakdown voltage $V_Z$ of the Zener diode 14, the Zener diode 14 is reversely conducts (or turned on) and then a large current $I_Z$ is provided to the RRAM cell 16. The current $I_S$ and the current $I_Z$ flow through the RRAM cell 16 at the same time, and the current $I_Z$ has a sufficient amount of current to change the impedance state of the RRAM cell 16 to a high impedance. In addition, the test voltage Vtest on the test pin 234 is a high voltage level or a high logic level, for example, a logic "1".

When the IC 200 is operated abnormal, the impedance state of the RRAM cell 16 can be obtained by measuring the voltage or logic level of the test pin 234. When the RRAM cell 16 has a low impedance, it is determined that the Zener diode 14 is not reverse turned on. Therefore, the power voltage PWR of the IC 200 is normal, and it is further determined that the abnormal operation is caused by the IC 200 itself, such as the operation of the functional circuit 220 is wrong or the IC 200 is damaged. Furthermore, when the RRAM cell 16 has a high impedance, it is determined that the Zener diode 14 is reversely turned on. Therefore, the power voltage PWR of the IC 200 is abnormal, and it is further determined that the abnormal operation is caused by an abnormal environmental operation such as a printed circuit board (PCB) instead of the IC 200.

After obtaining that the RRAM cell 16 has a high impedance, the setting signal Vset is changed from a low logic level to a high logic level, for example, a logic "1", so that the power verification circuit 210 is in a reset mode. In the reset mode, the setting signal Vset controls the transistors B1 and B2 to be turned off and controls the transistors A1 and A2 to be turned on. Thus, one end of the RRAM cell 16 is coupled to the power pin 232 (or the power terminal VDD) through the node n3 and the transistor A2. In addition, the other end of the RRAM cell 16 is coupled to the ground GND through the node n2 and the transistor A1. Therefore, the current Ireset from the power pin 232 will reset the RRAM cell 16 so as to convert the RRAM cell 16 from a high impedance to a low impedance, such as an initial state. After resetting the RRAM cell 16, the setting signal Vset is changed from a high logic level to a low logic level so that the power verification circuit 210 can continue to verify whether the power voltage PWR applied to the power pin 232 exceeds the maximum operating voltage of the IC 200.

Figure 5:
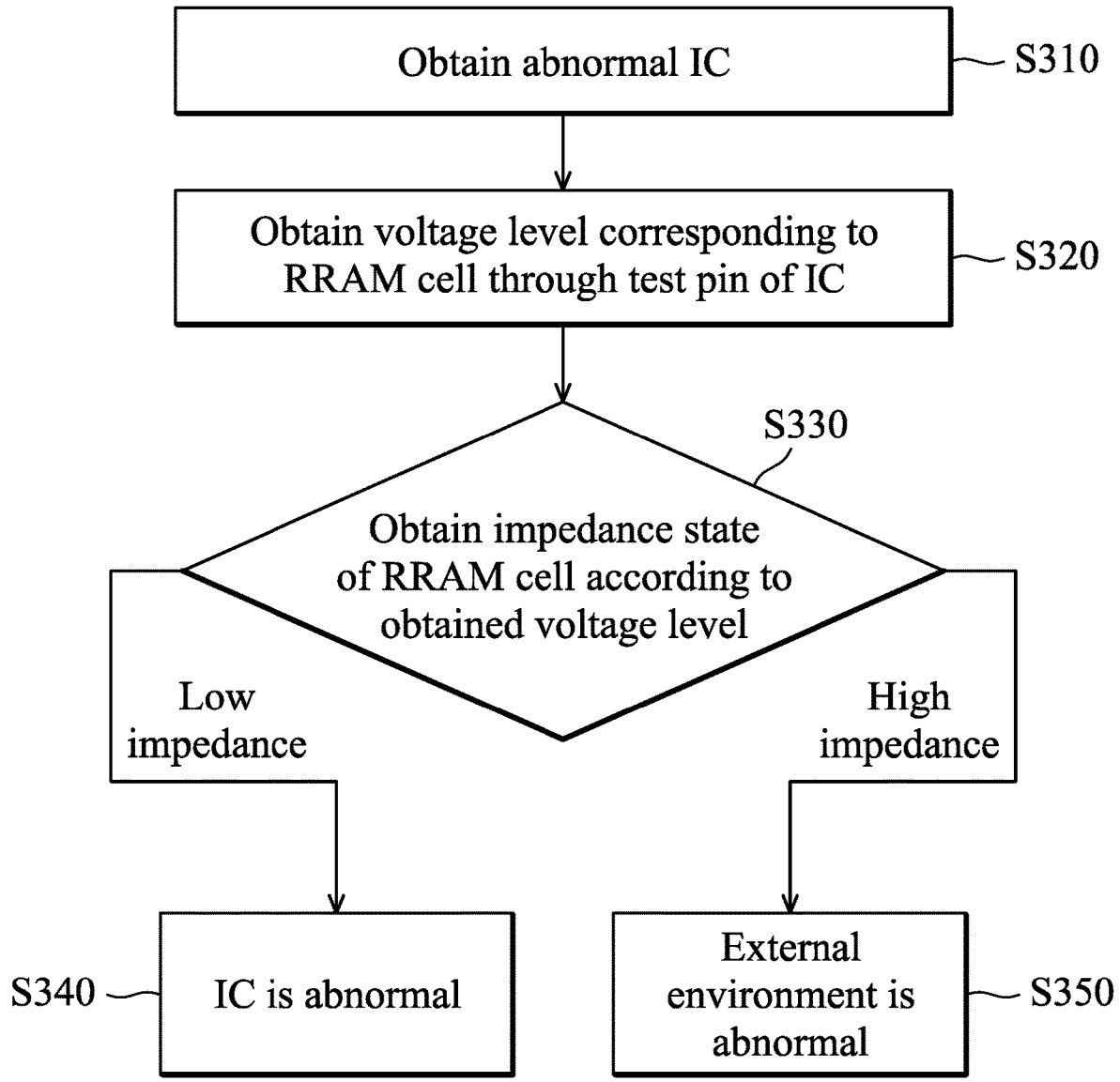
FIG. 5 shows a power verification method according to some embodiments of the present invention.

FIG. 5 shows a power verification method according to some embodiments of the present invention. First, in step S310, an IC with abnormal operation is obtained, and the IC includes a power verification circuit (for example, the power verification circuit 10 in FIG. 2 and the power verification circuit 210 in FIG. 4). As described above, the power verification circuit includes at least the current source 12, the Zener diode 14, and the RRAM cell 16. Next, in step S320, the voltage level corresponding to the RRAM cell 16 is obtained through a test pin (e.g., the test pin 234 in FIG. 4) of the IC. Next, in step S330, according to the obtained voltage level, the impedance state of the RRAM cell 16 is obtained. If the RRAM cell 16 has a low impedance, a low voltage level is obtained through the test pin of the IC. When the RRAM cell 16 has the low impedance, it is determined that an abnormality has occurred in the IC (step S340). Thus, the relevant personnel of the IC design company can verify and test the function of the IC in order to find out the error internal circuit or the error setting. On the contrary, if the RRAM cell 16 has a high impedance, a high voltage level is obtained through the test pin of the IC. When the RRAM cell 16 has the high impedance, it is determined that the abnormal is occurred in a circuit outside the IC (step S350), such as a printed circuit board. Therefore, the relevant environment and design provided by the customer are checked so as to find out the circuit or setting where the error occurs.

Figure 6:
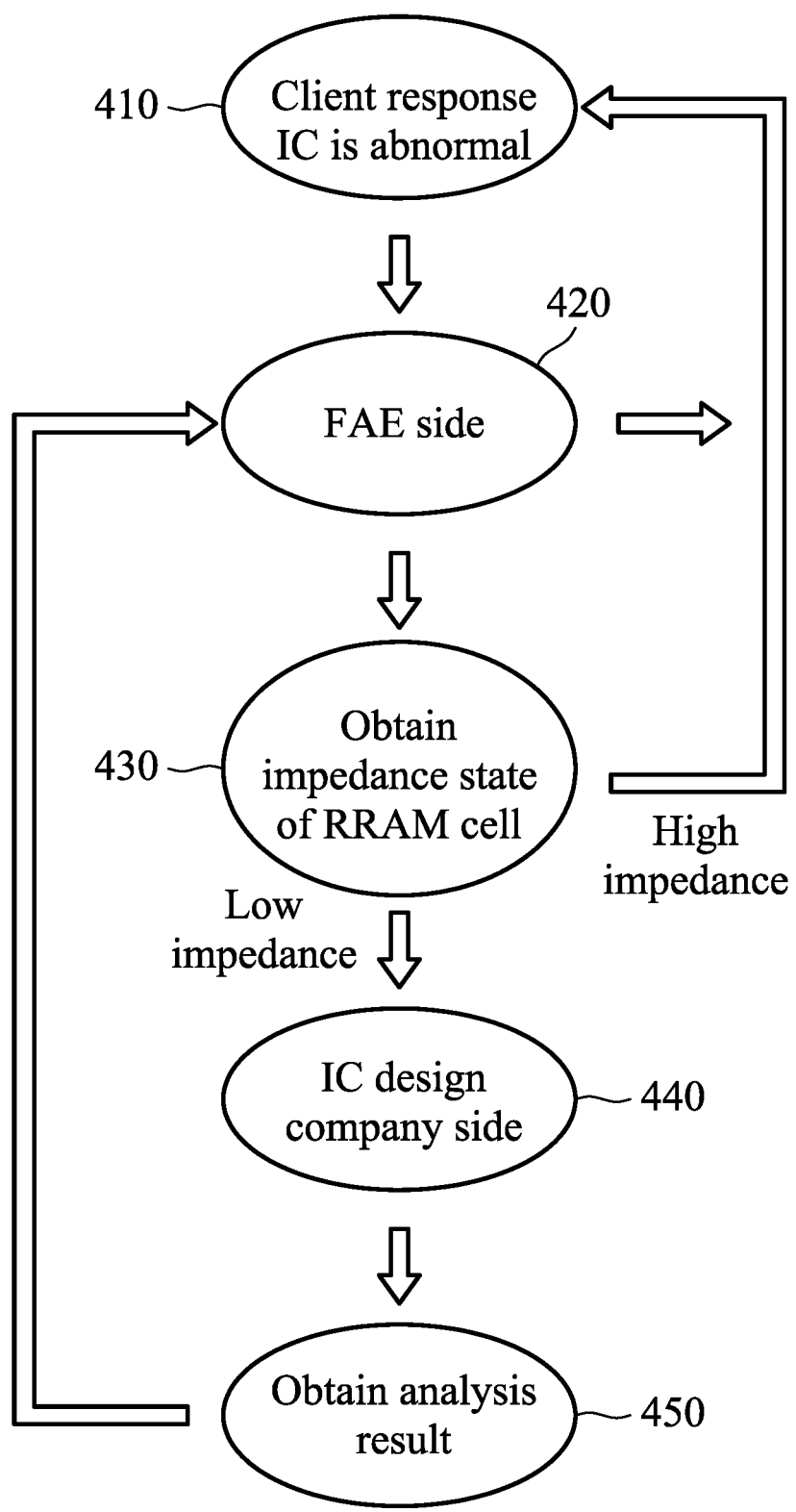
FIG. 6 shows a verification flow of an abnormal IC according to some embodiments of the present invention.

FIG. 6 shows a verification flow of an abnormal IC according to some embodiments of the present invention. In stage 410, the customer (i.e., the company that manufactures the electronic product) finds that the IC is abnormal and causes the electronic product cannot be used normally. In stage 420, the field application engineer (FAE) of the IC design (or production or manufacturing) company gets the abnormal IC at the customer. Next, in stage 420, the field application engineer obtains the voltage level corresponding to the RRAM cell through the test pins of the IC. Next, in stage 430, the field application engineer can obtain the impedance state of the RRAM cell according to the voltage level measured on the test pin of the IC. When the RRAM cell has a high impedance, the field application engineer can determine that the internal circuit of the IC is normal because the customer's environmental operation is abnormal (e.g., the power supply voltage is too high) and the IC cannot work normally. Therefore, on-site application engineers can immediately discuss and correct related problems of the application environment with customers, to avoid error operation in the external environment will continue to damage the IC.

In stage 430 of FIG. 6, when the RRAM cell has a low impedance, the field application engineer can determine that the customer's power supply voltage is normal because the internal circuit of the IC may be abnormal, which will cause the IC to failure or damage. Therefore, the field application engineer provides the abnormal IC to the IC design company. Next, in stage 440, the research and design engineer, the application engineer and/or the test engineer within the IC design company may further analyze and debug the abnormal IC provided by the FAE. Then, in stage 450, after obtaining the analysis result, the IC design company will provide the analysis result to the customer through the FAE. In addition, the IC design company will add test programs to verify anomalies to ensure that the ICs provided to customers will not be abnormal.

Figure 1:
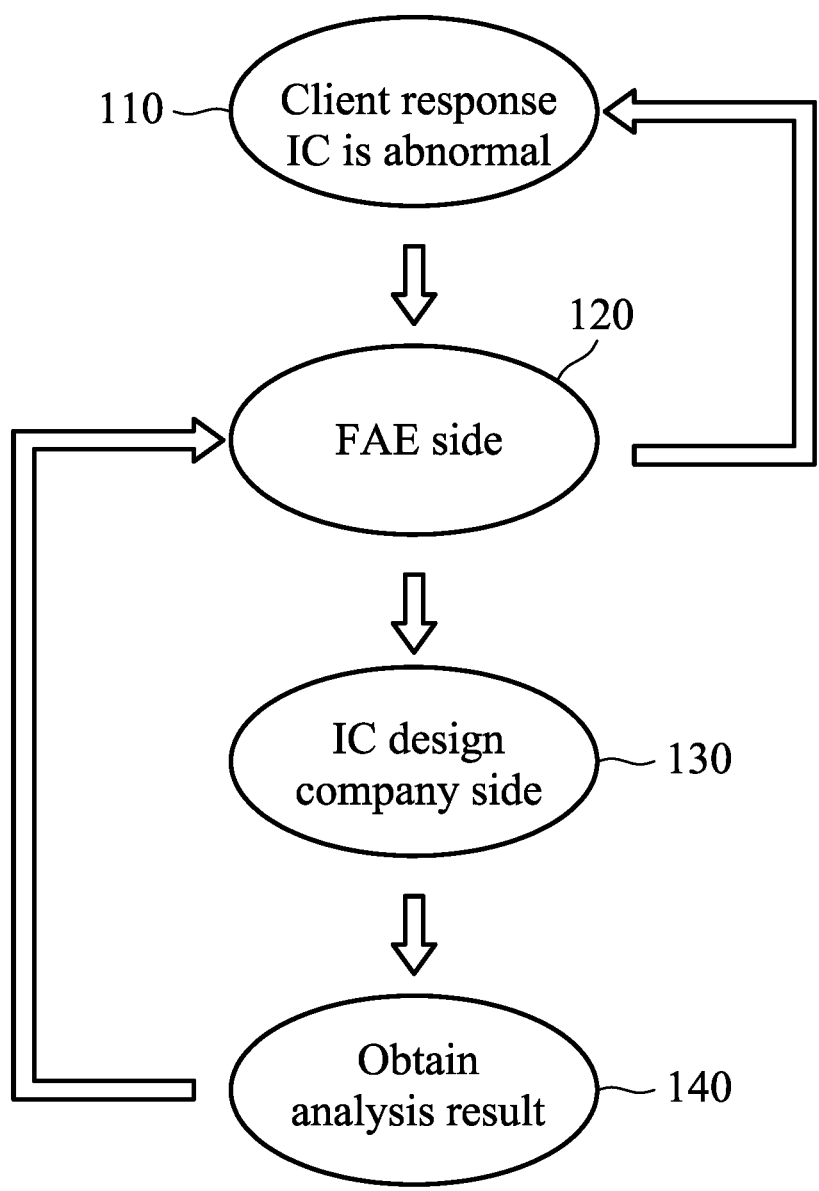
FIG. 1 shows a general verification flow of abnormal response of an IC.

Embodiments of the present invention are used to determine whether the IC is abnormal or an externally operated application is abnormal according to the impedance state of the RRAM cell 16, for example, the power voltage provided by the externally operated application exceeds the allowable maximum voltage value of the IC. Therefore, when detecting that the RRAM cell 16 has a high impedance, the field application engineer can report to the customer that there is a problem in the external operation application of the IC, and immediately correct it. Therefore, compared with the conventional verification process of FIG. 1, in the embodiments of the present invention, the research and design engineers, the application engineers, and/or the test engineers within an IC design company do not need to analysis and debug the RRAM cell 16 with a high impedance. The research and design engineer, the application engineer and/or the test engineer need only analyze and debug the IC of the RRAM cell 16 with a low impedance. Therefore, the abnormal type of the IC can be effectively and clearly distinguished, and the verification direction can be further provided, so that the verification cycle can be accelerated, for example, analysis and debugging time can be reduced by half.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power verification circuit, comprising:
   a current source coupled to a power terminal;
   a resistive random access memory (RRAM) cell directly connected between the current source and a ground; and
   a Zener diode having an anode directly connected to the resistive random access memory cell and a cathode coupled to the power terminal,
   wherein impedance of the resistive random access memory cell is determined by a power voltage applied to the power terminal.

2. The power verification circuit as claimed in claim 1, wherein when the power voltage applied to the power terminal exceeds a specific voltage value, the Zener diode is reversely conducted, so that the resistive random access memory cell has a high impedance, wherein the specific voltage value is a breakdown voltage value of the Zener diode.

3. The power verification circuit as claimed in claim 2, wherein when the power voltage applied to the power terminal does not exceed the specific voltage value, the Zener diode is not turned on, and the resistive random access memory cell has a low impedance.

4. The power verification circuit as claimed in claim 1, wherein when the power voltage applied to the power terminal exceeds or equals a breakdown voltage of the Zener diode, in response to a first current from the Zener diode, the resistive random access memory cell is changed from a low impedance changes to a high impedance.

5. The power verification circuit as claimed in claim 4, wherein when the power voltage applied to the power terminal does not exceed the breakdown voltage of the Zener diode, in response to a second current from the current source, the resistive random access memory cell has the low impedance, wherein the first current is greater than the second current.

6. An integrated circuit (IC), comprising:
   a power pin configured to receive a power voltage;
   a test pin; and
   a power verification circuit, comprising:
      a current source directly connected between the power pin and the test pin;
      a Zener diode having an anode directly connected to the test pin and a cathode directly connected to the power pin; and
      a resistive random access memory (RRAM) cell coupled between the test pin and a ground; and
   wherein a voltage of the test pin is configured to indicate whether the power voltage exceeds a maximum operating voltage of the IC, wherein the maximum operating voltage is a breakdown voltage of the Zener diode;
   wherein when the power voltage exceeds or equals the maximum operating voltage of the IC, the test pin has a high voltage level, and when the power voltage does not exceed the maximum operating voltage of the IC, the test pin has a low voltage level.

7. The IC as claimed in claim 6, wherein when the power voltage does not exceed the maximum operating voltage, the resistive random access memory cell has a low impedance, so that the test pin has the low voltage level.

8. The IC as claimed in claim 6, wherein when the power voltage exceeds or equals the maximum operating voltage, in response to a current from the Zener diode, the resistive random access memory cell has a high impedance, so that the test pin has the high voltage level.

9. The IC as claimed in claim 6, further comprising:
   a setting pin configured to receive a setting signal;
   wherein the power verification circuit further comprises:
      a first transistor coupled between the test pin and the resistive random access memory unit; and
      a second transistor coupled between the resistive random access memory unit and the ground;
   wherein the setting signal is configured to control whether the first transistor and the second transistor are turned on or off.

10. The IC as claimed in claim 9, wherein the power verification circuit further comprises:
    an inverter having an input terminal coupled to the setting pin, and an output terminal coupled to gates of the first transistor and the second transistor;
    a third transistor coupled between the second transistor and the power pin, having a gate coupled to the setting pin; and
    a fourth transistor coupled between the first transistor and the ground, having a gate coupled to the setting pin,
    wherein the first, second, third and fourth transistors are N-Type transistors.

11. The IC as claimed in claim 10, wherein when the setting signal controls the first and second transistors to be turned on, the third and fourth transistors are turned off, and an impedance of the resistive random access memory cell is determined by the power voltage.

12. The IC as claimed in claim 10, wherein when the setting signal controls the third and fourth transistors to be turned on, the first and second transistors are turned off, and the resistive random access memory cell has a low impedance.

13. A power verification method, comprising:
    obtaining an integrated circuit, wherein the integrated circuit comprises:
       a test pin;
       a current source directly connected between a power terminal and the test pin;
       a resistive random access memory (RRAM) cell directly connected between the test pin and a ground; and a Zener diode having an anode directly connected to the test pin and a cathode directly connected to the power terminal;

obtaining impedance of the resistive random access memory cell according to a voltage of the test pin; and determining whether a power voltage applied to the power terminal exceeds a maximum operating voltage of the integrated circuit according to the impedance of the resistive random access memory cell, wherein the maximum operating voltage is a breakdown voltage of the Zener diode.

14. The power verification method as claimed in claim 13, wherein when the resistive random access memory cell has a low impedance, the power voltage applied to the power terminal does not exceed the maximum operating voltage of the integrated circuit, and when the resistive random access memory cell has a high impedance, the power voltage applied to the power terminal exceeds or equals the maximum operating voltage of the integrated circuit.

15. The power verification method as claimed in claim 13, further comprising:

resetting the resistive random access memory cell to a low impedance through a setting pin of the integrated circuit.

* * * * *